United States Patent [19]
Kinokiri et al.

[11] Patent Number: 5,254,236
[45] Date of Patent: Oct. 19, 1993

[54] SPUTTERING APPARATUS

[75] Inventors: Kyoji Kinokiri, Tokyo; Jiro Ikeda, Fujieda, both of Japan

[73] Assignee: Shibaura Engineering Works Co., Ltd., Japan

[21] Appl. No.: 767,399

[22] Filed: Sep. 30, 1991

[30] Foreign Application Priority Data

Jan. 25, 1991 [JP] Japan ................................. 3-025473

[51] Int. Cl.$^5$ ............................................. C23C 14/34
[52] U.S. Cl. ........................ 204/298.11; 204/298.07; 204/298.2; 204/298.25; 204/298.28; 204/192.12
[58] Field of Search .................. 204/192.12, 298.07, 204/298.11, 298.15, 298.19, 298.20, 298.33, 298.25, 298.26, 298.28

[56] References Cited

U.S. PATENT DOCUMENTS

| | | | |
|---|---|---|---|
| 4,444,643 | 4/1984 | Garrett | 204/298.2 |
| 4,820,371 | 4/1989 | Rose | 156/345 |
| 4,849,087 | 7/1989 | Meyer | 204/298.07 X |
| 4,886,592 | 12/1989 | Anderle et al. | 204/298 |
| 4,938,858 | 7/1990 | Zejda | 204/298.25 |

FOREIGN PATENT DOCUMENTS

A0154859 9/1985 European Pat. Off. .
61-12035 1/1986 Japan .

OTHER PUBLICATIONS

Singulus Catalog (not clearly dated) "A Family of Single Disc Metallizing Systems".

*Primary Examiner*—Nam Nguyen
*Attorney, Agent, or Firm*—Wigman, Cohen, Leitner & Myers

[57] ABSTRACT

In a sputtering apparatus comprising a film-deposition chamber having a gas-supplying pipe connected thereto, for depositing a film on the surface of a substrate to be processed, a target provided in the film-deposition chamber, a mask having an opening portion and a masking portion, the mask being provided opposing to the target in the film-deposition chamber, and holding means for holding the substrate against the mask in such a manner that the film-depositing surface of the substrate is in close contact with the mask, the improvement according to the present invention comprises a mask having exhaust passages formed in the masking portion thereof, each of exhaust passages having one end exposed to the inside of the film-deposition chamber and the other end exposed to the outside of the film-deposition chamber, the one end of each of the exhaust passages and the other end thereof being communicated with each other, but not seen through each other.

20 Claims, 3 Drawing Sheets

SPUTTERING APPARATUS

BACKGROUND OF THE INVENTION

1. Field of the Invention:

This invention relates to a sputtering apparatus, and more particularly to a sputtering apparatus suitable for selectively depositing a film on the surface of an object to be processed in such a manner that the surface of the object is held in close contact with a mask.

2. Description of the Prior Art:

In recent years, a compact disc (hereinafter referred to as a CD) and a laser disc have been widely used, which can record a large amount of digitized sound and image information. The substrate of the CD is made of transparent synthetic resin such as polycarbonate and the like. A large number of so-called pits, which are minute concavo-convex portions, are formed on the surface of the substrate in accordance with digital information of "1" or "o". Further, an aluminum thin film layer having a high light-reflectivity is deposited on the pits-formed surface of the substrate by use of a sputtering technique. The thus recorded information can be read by the presence or absence of the reflected light of a laser light-beam applied to the CD. The aluminum thin film deposition per a single sheet of the disc substrates can be performed in a relatively short time. Thus, an apparatus shown in FIG. 6 has been employed in which the aluminum thin film can be continuously deposited on a large number of the disc substrates in a sheet-by-sheet manner.

FIG. 6 is a schematic diagram illustrating only the essential portions of a continuous sputtering apparatus. In FIG. 6, a large number of substrates 62 of CD and the like are sequentially transferred by use of an external transferring apparatus 61, such as a belt-conveyor and the like. The thus transferred substrates 62 are captured by suction pads 64 provided on a disc-shaped internal transferring apparatus 63, which is rotatable about its shaft and movable in a vertical direction, and then transferred into a transferring chamber 65. In the transferring chamber 65, substrates 62 are placed on a transferring table 66 which is rotatable about its shaft and movable in a vertical direction. The thus placed substrates 62 are sputtered by use of a sputtering source 67 in a prescribed sheet-by-sheet manner. After the completion of sputtering, the substrates 62 are sequentially taken out by use of the transferring table 66 and the internal transferring apparatus 63.

FIG. 7 is an enlarged cross-sectional view illustrating the vicinity of the sputtering source 67. In FIG. 7, a mask 69 is provided under an aluminum target 68 which is used in the sputtering source 67. The substrate 62 is pushed up against the mask 69 by the transferring table 66 so as to make close contact with the mask 69. A film-deposition chamber 70, in which the sputtering for film deposition is performed, is constituted by a space surrounded with an envelope 71, the aluminum target 68 and the mask 69. The exhaust of the film-deposition chamber 70 is performed, while the substrate 62 is not in close contact with the mask 69, by use of a turbomolecular pump (not shown) through an opening 69a of the mask 69 and an exhaust pipe 72 connected to the transferring chamber 65. Assume that the substrate 62 is in close contact with the mask 69 for the film-deposition process. In this case, the surface of substrate 62 is partially exposed or masked with respect to the aluminum target 68. Specifically, an aluminum film is deposited only on the portion of the substrate 62 corresponding to the opening 69a of the mask 69. The aluminum film is not deposited on the portion of the substrate 82 masked by the mask 69. The mask 69 is manufactured with high accuracy, and fixed to the envelope 71 at its opening 74 so as to be in close contact therewith by use of a thermal-expansion force of the mask 69. In the process of sputtering for film deposition, argon gas is introduced into the film-deposition chamber 70 through a gas-supplying pipe 73. Further, a voltage is applied to the aluminum target 68 through an electrode (not shown), and the target 68 is bombarded by the separated argon atoms. Thus, aluminum atoms are freed from the target 68, and then deposited on the surface of substrate 62 at the portion which has not been masked by the mask 69. As a result, the aluminum thin film layer can be deposited on the surface of substrate 62. After the completion of the film-deposition process, the discharge is stopped, and the substrate 62 is transferred from the transferring table 66 to the internal transferring apparatus 63, and then transferred to the outside.

In the above-described sputtering apparatus, the processes of transfer and film-deposition per a sheet of substrates 62 are performed in a short period of about 6 seconds. The actual film-deposition process is performed in an extremely short period of about 2 seconds in which the electric field is being applied to the target 68. Assume that the gas is continuously supplied through the gas-supplying pipe 73 to the film-deposition chamber 70 which is hermetically sealed by the mask 69 and the substrate 62 and has no exhaust holes. In this case, the pressure in the film-deposition chamber 70 is continuously increased even in a short period of about 2 seconds for the film-deposition process. Thus, the discharge current-voltage characteristics in the film-deposition process are inevitably changed. As a result, the stable film-depositing conditions cannot be assuredly obtained. In order to stabilize the pressure in the film-deposition chamber 70, a plurality of exhaust holes 75 are provided in the envelope 71 at the positions adjacent to the mask 69, as shown in FIG. 7. The exhaust holes 75 serve to by-pass the pressure in the film-deposition chamber 70 to the transferring chamber 65. However, aluminum for use in the film-deposition sputtering process inevitably flows into the transferring chamber 65 through the exhaust holes 75. As a result, such aluminum contaminates the transferring chamber 65. Therefore, it is not appropriate countermeasure to provide the exhaust holes 75 in the boundary wall between the film-deposition chamber 70 and the transferring chamber 65.

As described above, in the conventional sputtering apparatus, the pressure in the film-deposition chamber 70 cannot be stabilized without the exhaust holes 75. However, when the exhaust holes 75 are provided for by-passing the pressure in the film-deposition chamber 70, the sputtering material, i.e., aluminum inevitably contaminates the inside of the exhaust holes 75 and the transferring chamber 65. Thus, the satisfactory sputtering conditions for the prescribed film-deposition process cannot be easily maintained.

SUMMARY OF THE INVENTION

Accordingly, one object of the present invention is to provide a sputtering apparatus in which the pressure in a film-deposition chamber can be stabilized in the process of sputtering while the inside of a transferring chamber is not contaminated by a sputtering material.

Thus, the satisfactory film deposition can be reliably obtained with superior reproducibility.

Briefly, in accordance with one aspect of the present invention, there is provided a sputtering apparatus which comprises a film-deposition chamber having a gas-supplying pipe connected thereto, for depositing a film on the surface of a substrate to be processed, a target provided in the film-deposition chamber, a mask provided opposing to the target in the film-deposition chamber, the mask having an opening portion and a masking portion, and holding means for holding the substrate against the mask in such a manner that the film-depositing surface of the substrate is in close contact with the mask, the improvement of the apparatus comprises a mask having exhaust passages formed in the masking portion thereof, each of exhaust passages having one end exposed to the inside of the film-deposition chamber and the other end exposed to the outside of the film-deposition chamber, the one end of each of the exhaust passages and the other end thereof being communicated with each other, but not in a straight line path.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4b is a cross-sectional view illustrating an essential portion of the second embodiment shown in FIG. 4a;

DESCRIPTION OF THE PREFERRED EMBODIMENTS

Figure 1:
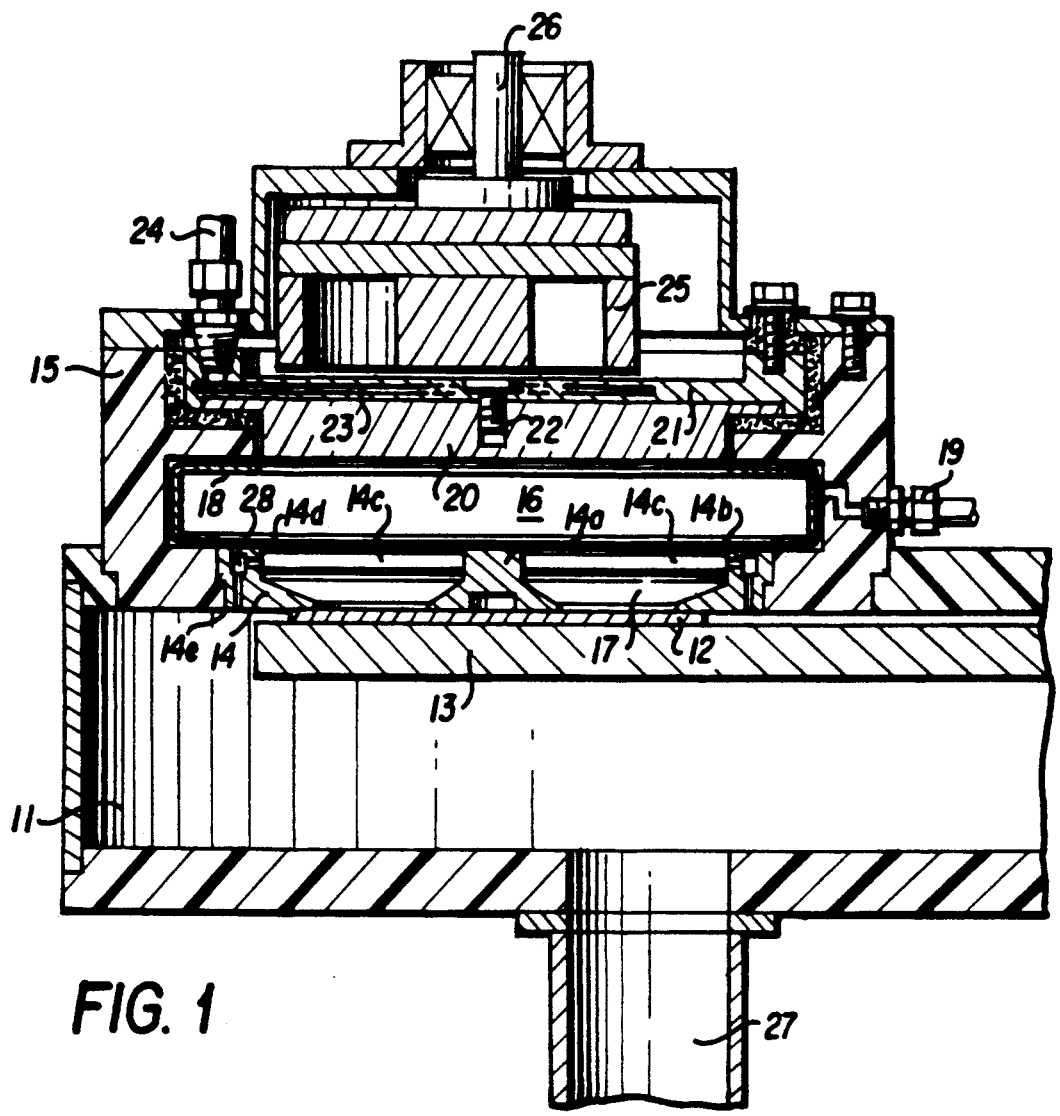
FIG. 1 is a cross-sectional view illustrating a first embodiment according to the present invention.

FIG. 1 is a cross-sectional view illustrating a sputtering apparatus according to the present invention. In FIG. 1, a substrate 12 is transferring into a transferable chamber 11 by use of an internal transferring apparatus (not shown). The substrate 12 is placed on a transferring table 13 which is rotatable about its shaft and also movable in a vertical direction. FIG. 1 shows the state in which the substrate 12 was pushed up by the transferring table 13 so as to be in close contact with a mask 14. A film-deposition chamber 16 is incorporated in an envelope 15, and an opening 17 is provided in the wall of the envelope 15 at a position under the film-deposition chamber 16. The mask 14 is hermetically fixed to the opening 17 by use of a thermal-expansion force of the mask 14, as shown in FIG. 1. A protective shield 18 is provided on the inner wall of the film-deposition chamber 16. The protective shield 18 serves to prevent the sputtering material from sticking to the inner wall of the film-deposition chamber 16 in the process of sputtering. A gas-supplying pipe 19 is connected to the film-deposition chamber 16 so as to supply argon gas thereto. A target plate 20 made of aluminum is disposed in the upper portion of the film-deposition chamber 16, opposing to the mask 14. An electrode (not shown) is connected to the aluminum target plate 20 which serves as a cathode electrode. The aluminum target 20 is fixed by screws to a backing plate 21 which is made of a material having a high thermal conductivity, and has a ring-shaped water passage 23 formed therein. A feed-water pipe 24 is connected to the water passage 23 formed in the backing plate 21. Thus, cooling water can be fed into the water passage 23 through the feed-water pipe 24 so as the refrigerate the aluminum target plate 20. In operation, a discharge electric field of about 75 W/cm$^2$ is generated on the surface of the aluminum target plate 20. This causes the temperature increase of the aluminum target plate 20 in the process of film deposition, and such temperature must be between 200 degrees C. and 300 degrees C. For this reason, the aluminum target plate 20 must be refrigerated by use of the backing plate 21. A magnet 25 is disposed at a position over the backing plate 21. The magnet 25 is eccentrically attached to a shaft 26 connected to an electric motor (not shown). Thus, the magnet 25 is rotated eccentrically with respect to the backing plate 21. As a result, an uniform magnetic field can be generated in the film-deposition chamber 16. Further, argon gas is supplied to the film-deposition chamber 16 through the gas-supplying pipe 19, and the pressure in the chamber 16 in the film-deposition process is determined to be in a range of 0.2 to 0.5 Pa. The pressure in the film-deposition chamber 16 must be determined depending on the operating conditions. Further, the entire exhaust of the sputtering apparatus is performed by use of an exhaust vent 27 provided in the lower portion of the transferring chamber 11. The exhaust of the film-deposition chamber 16, which will be later described in detail, is performed by use of redirected, or refracted exhaust passages 28 formed in the improved mask 14 according to the present invention. In the process of sputtering, a voltage is applied to the aluminum target plate 20 through the electrode (not shown). This causes dislodge argon atoms to bombard the aluminum target plate 20 so as to free aluminum atoms therefrom. The thus freed aluminum atoms move through the opening 17 of the mask 14 toward the Surface Of the substrate 12 and stick thereto. As a result, an aluminum thin film is deposited on the surface of the substrate 12. After completion of the film-deposition process, the discharge is stopped, and then the substrate 12 is transferred to the outside by use of the transferring table 13.

The mask 14 is constituted in accordance with the shape of CD, i.e., the substrate 12. Specifically, the mask 14 comprises a circular center masking portion 14a corresponding to a CD label-sticking portion, a circular peripheral masking portion 14b, and a bridging portion 14c for connecting the portions 14a and 14b. The inner side surface 14d of the circular peripheral masking portion 14b opposes to the inside of the film-deposition chamber 16, and the lower side surface 14e of the portion i4b opposes to the inside of the transferring chamber 11. The above-described redirected, or refracted exhaust passages 28 are formed in the circular peripheral masking portion 14b of the mask 14. Each of the exhaust passages 28 has one end exposed to the inner side surface 14d of the circular peripheral masking portion 14b of the mask 14, and the other end exposed to the lower side surface 14e.

As described above, the exhaust passages 28 are formed in the circular peripheral masking portion 14b of the mask 14. Thus, the sputtering gas of aluminum and the like, which is generated in the film-deposition chamber 16 in the film-deposition process, is captured by the inner walls of the exhaust passages 28. As a result, such sputtering gas ca be prevented from leaking out to the inside of the transferring chamber 11. In other words, the sputtering material that might contaminate the inside of the transferring chamber 11 can be captured by the inner wall of the exhaust passages 28 while the pressure in the film-deposition chamber 16 is by-passed through the exhaust passages 28 and the exhaust vent 27 to the outside.

Figure 2:
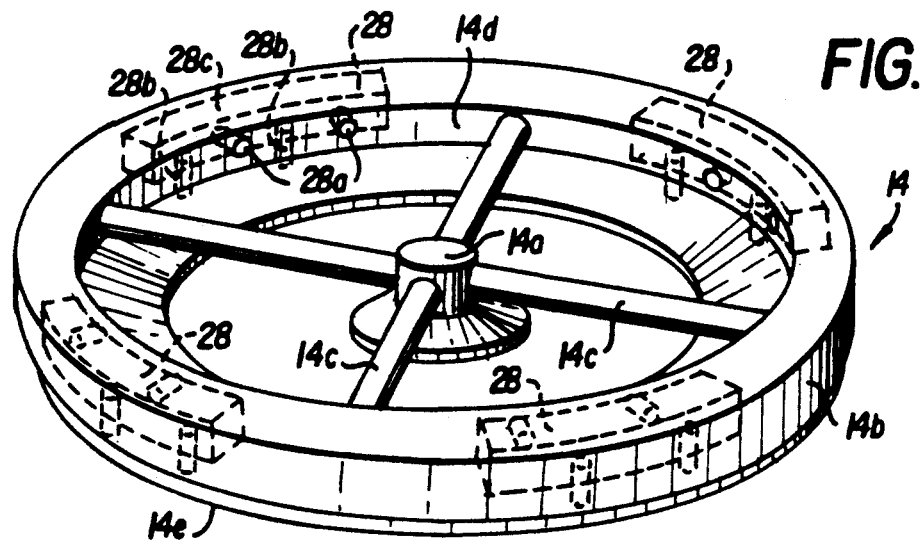
FIG. 2 is a partially transparent perspective view illustrating an essential portion of the first embodiment shown in FIG. 1.
Figure 3:
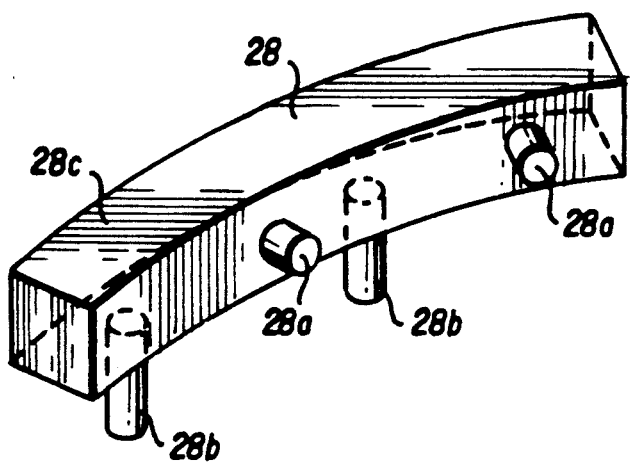
FIG. 3 is a partially transparent perspective view of the first embodiment shown in FIG. 2.

Next, the structure of the improved mask according to the present invention will be described in detail. FIG. 2 is a partially transparent perspective view illustrating the mask 14 shown in FIG. 1, and FIG. 3 is an enlarged perspective view illustrating one of the refracted exhaust passages 28 formed in the mask 14 shown in FIG. 2. In FIG. 2, the redirected, or refracted exhaust passages 28, which are constituted by four groups of the same configuration, are formed in the circular peripheral masking portion 14b of the mask 14 at positions opposing to each other. Further, the bridging portion 14c is constituted by four supporting rods of the same length disposed in perpendicular to each other. Each of supporting rods has one end connected to the circular center masking portion 14a and the other end connected to the inner side surface 14d of the circular peripheral masking portion 14b of the mask 14. The four groups of the exhaust passages 28 are respectively formed in the circular peripheral masking portion 14b at positions between the four supporting rods. Each of four exhaust passages 28 is constituted by a pair of horizontal exhaust passages 28a which are in parallel each other and exposed perpendicularly to the inner side surface 14d of the circular peripheral masking portion 14b, a pair of vertical exhaust passages 28b which are in parallel to each other and exposed perpendicularly to the lower side surface 14e or the portion 14b. and a cavity portion 28c. The arc-shape of the cavity portion 28c is formed in accordance with the shape of the circular peripheral masking portion 14b of the mask 14. The pair of horizontal exhaust passages 28a and the pair of vertical exhaust passages 28b are disposed on planes different from each other such that the respective extension lines of passages 28a and 28b do not intersect, i.e., they are positioned deviating from each other.

Next, the functions of the above-described redirected, or refracted exhaust passages 28 in the film-deposition process will be described. The sputtering gas inhaled from the film-deposition chamber 16 through the horizontal exhaust passages 28a is exhausted to the transferring chamber 11 through the cavity portion 28c and the vertical exhaust passages 28b. While the sputtering gas is passing through the exhaust passages 28, the aluminum component in the sputtering gas is adsorbed on the inner wall surfaces of the refracted exhaust passages 28 constituted by the horizontal exhaust passages 28a, the cavity portion 28c and the vertical exhaust passages 28b. Such adsorption progresses from the vicinity of the film-deposition chamber 16. Thus, the transferring chamber 11 can be protected from being contaminated with the aluminum component. Further, the exhaust passages 28 comprise the horizontal and vertical exhaust passages 28a and 28b formed at positions deviating from each other and the cavity portions 28c interposed therebetween. Therefore, the passages through which the sputtering gas passes can be longer and the inner wall surfaces on which the sputtering gas is adsorbed can be larger. As a result, the efficiency of adsorbing undesirable aluminum component can be significantly enhanced.

In a vacuum, most of particles sputtered from the target material (aluminum and the like) freely float in an atom state or in a molecule state, and move repeating collisions with each other. In this case, an average distance from a collision to another is called an mean free path $\lambda$ (mm), which depends only on the pressure P Pa in the case of argon atoms and aluminum atoms. The relationship between the mean free path $\lambda$ and the pressure P can be expressed approximately by $\lambda = 10/P$. Further, when molecules of the target material (aluminum and the like) collide with walls once or twice in a room temperature state, they usually stick to the walls and never again evaporate and float. Thus, the dimensions, such as a diameter D, a length L and a redirected, or refracted angle, of the exhaust passages 28 of the mask 14 are determined taking into consideration the pressure and the means free distance in a given state. Assuming that the ratio of the sputtered particles of the target material, which pass through the exits of the exhaust passages 28, i.e., the ends of the vertical exhaust passages 28b, to the entire sputtered particles of the target material must be 1/10000 at a maximum. In this case, the diameter D of the horizontal and vertical exhaust passages 28a and 28b must be $\lambda/2$ at a maximum, and the length L of the horizontal and vertical exhaust passages 28a and 28b must be 3D at minimum. If the above-described conditions are satisfied, the advantages of this invention can be satisfactorily obtained. Further, each of the exhaust passages 28 must be redirected at least once such that the entrance and exit thereof cannot directly see through each i.e., are not in a straight line path. The redirected, or refracted exhaust passages 28 can be manufactured in the following manner. Specifically, prescribed bores and grooves are made in the lower portion of the mask 14 by use of machinery cuts. Thereafter, the upper portion of the mask 14, i.e., a lid is fixed to the lower portion of the mask 14 by use of a brazing technique (refer to 29 in FIG. 4b).

Figure 4A:
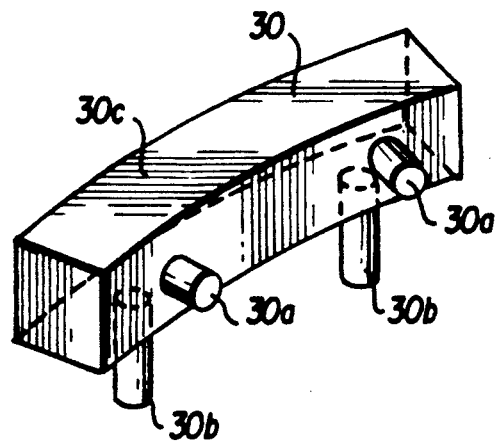
FIG. 4a is partially-transparent enlarged perspective view illustrating an essential portion of a second embodiment according to the present invention.
Figure 4B:
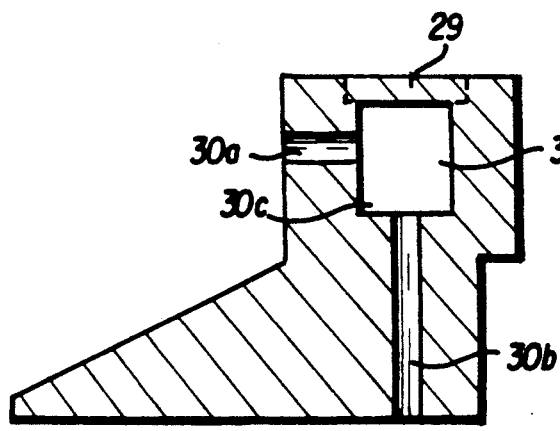

Next, a second embodiment according to the present invention will be described with reference to FIGS. 4a and 4b. FIG. 4a is a partially-transparent enlarged perspective view, and FIG. 4b is cross-sectioned view, respectively illustrating one of redirected, or refracted exhaust passages formed in a mask according to the second embodiment. In FIGS. 4a and 4b an exhaust passage 30 is constituted by two pairs of horizontal and vertical exhaust passages 30a and 30b, and a cavity portion 30c. Each pair of the horizontal and vertical exhaust passages 30a and 30b are formed in perpendicular to each other, but on the same plane. Thus, in this embodiment, the refracted exhaust passages are shorter than those of the first embodiment according to the present invention which has been described with reference to FIG. 3. However, the cavity portions 30c can also be shorter than those of the first embodiment.

Next, a third embodiment according to the present invention will be described with reference to FIG. 5.

Figure 5:
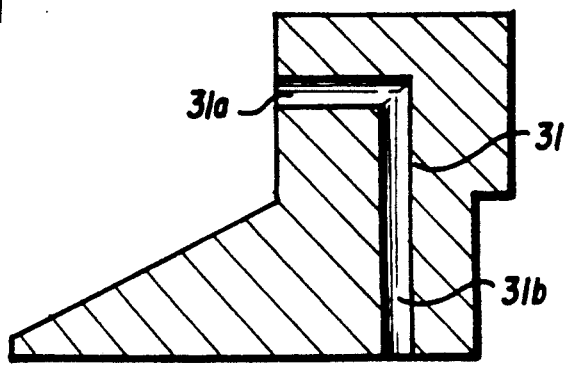
FIG. 5 is a cross-sectional view illustrating an essential portion of a third embodiment according to the present invention.
Figure 6:
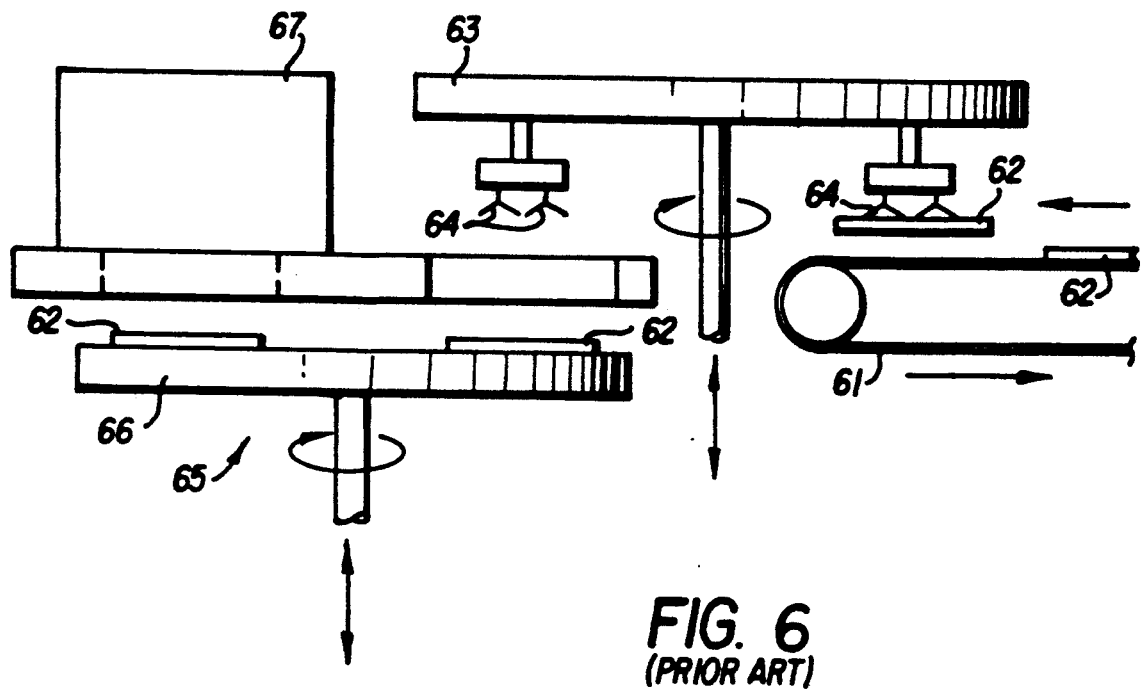
FIG. 6 is a schematic diagram illustrating a conventional sputtering apparatus.
Figure 7:
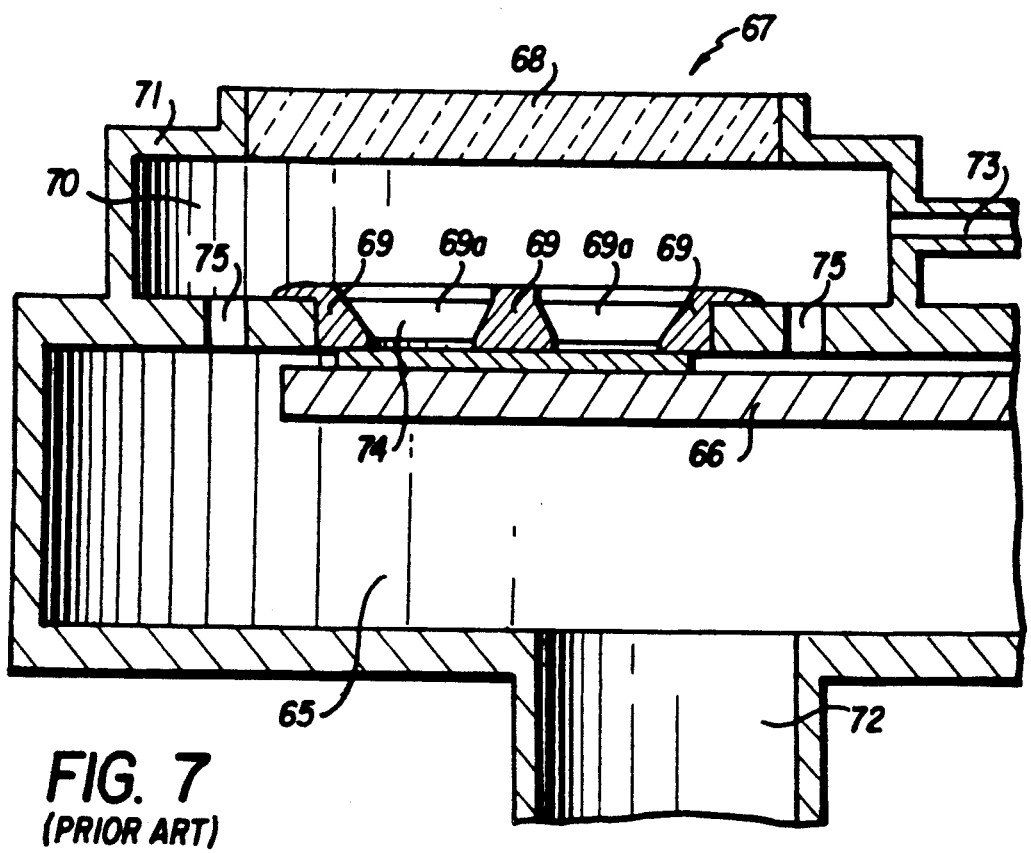
FIG. 7 is an enlarged cross-sectional view illustrating a part of the conventional sputtering apparatus.

FIG. 5 is a cross-sectional view illustrating one the redirected exhaust passages formed in a mask. This embodiment differs from the first and second embodiments in that an exhaust passage 31 is constituted by a horizontal exhaust passages 31a and a vertical exhaust passage 31b, which are directly connected to each other without a cavity portion. In this embodiment, the adsorption area for adsorbing the sputtering gas is smaller than that of other embodiments. However, the exhaust passage 31 can be easily manufactured because of its simplified structure. Specifically, the refracted exhaust passage 31 can be formed by the machinery cuts only from both sides of its entrance and exit.

The most suitable exhaust passages ca be selected from those in the first through third embodiments according to the present invention depending on the kinds and sizes of mask to be applied or on the kinds of sputtering gas for the film-deposition process. Further, in the second and third embodiments, the number of exhaust passages per unit length in the mask can be determined to be greater than that in the first embodiment.

Moreover, the removal of the sputtering material (e.g. aluminum) adsorbed on the inner wall surface of the refracted exhaust passages in the mask can be easily performed in the following manner. Specifically, the mask is detached from the sputtering apparatus, and entire the mask is immersed in a solution of caustic soda or caustic potash so that the adsorbed sputtering material can be easily removed by washing. In the above-described embodiments, the masks for use in manufacturing CD have been described. Thus, each of the masks has the circular center masking portion at its center portion. However, the present invention is not limited to this, but can also be applied to a simply ring-shaped mask.

Further, in the above-described embodiments, the bridging portion of the mask comprises four supporting rods, however, the present invention is not limited to the number of four. Moreover, in the above-described embodiments, the passages are formed in the mask at the positions between the supporting rods, however, any other positions may also be possible. Further, in the above-described embodiments, the exhaust passages are redirected at right angles. However, the present invention is not limited to this, but the exhaust passages can also be redirected at any angles other than a right angle or redirected with an arbitrary curvature.

As described above, the sputtering apparatus according to the present invention can prevent the pressure fluctuations in the film-deposition chamber in the process of sputtering for film deposition. Further, the apparatus can also prevent the sputtering gas from leaking out, thereby the contamination with sputtering material can be confined in the redirected, or refracted exhaust passages. The above-described advantages can be obtained by the simplified configuration such that the redirected, or refracted exhaust passages ar formed in the detachable mask. Thus, the contamination with the sputtering material can be prevented from diffusing to other regions of the apparatus. As a result, an uniform thin film layer of good quality can be assuredly obtained with superior reproducibility under the prescribed constant sputtering conditions, whereby the availability of the entire apparatus can be significantly enhanced.

Obviously, numerous additional modifications and variations of the present invention are possible in light of the above teachings. It is therefore to be understood that within the scope of the appended claims, the invention may be practiced otherwise than as specifically described herein.

What is claimed is:

1. A sputtering apparatus comprising:
   a film-deposition chamber having a gas-supplying pipe connected thereto, for depositing a film on the surface of a substrate to be processed,
   a target provided in said film-deposition chamber,
   a mask provided opposite said target in said film-deposition chamber, said mask having an opening portion and a masking portion, and
   holding means for holding said substrate against said mask in such a manner that the film-deposition surface of said substrate is in close contact with said mask,
   wherein said mask further includes exhaust passages formed in the masking portion thereof, each of said exhaust passages having a first end exposed to the inside of said film-deposition chamber and an other end exposed to the outside of said film-deposition chamber, wherein each of said exhaust passage first ends and said other end thereof communicate with each other, but not in a straight line path.

2. The sputtering apparatus of claim 1, wherein each of said exhaust passages comprises a first linear-shaped exhaust passage exposed to the inside of said film-deposition chamber and a second linear-shaped exhaust passage exposed to the outside of said film-deposition chamber.

3. The sputtering apparatus of claim 2, wherein each of said first exhaust passages is formed perpendicular to a corresponding one of said second exhaust passages.

4. The sputtering apparatus of claim 2, wherein each of said first exhaust passages and a corresponding one of said second exhaust passages are respectively formed in planes different from each other.

5. The sputtering apparatus of claim 2, wherein each of said first exhaust passages and a corresponding one of said second exhaust passages are formed in the same plane.

6. The sputtering apparatus of claim 2, wherein the masking portion of said mask has cavity portions formed between said first and second exhaust passages.

7. The sputtering apparatus of claim 6, wherein the number of said first and second exhaust passages is at least two.

8. The sputtering apparatus of claim 1, wherein said exhaust passages are redirected in the masking portion of said mask.

9. The sputtering apparatus of claim 1, wherein said mask comprises a circular peripheral masking portion having at least an inner side surface and a lower side surface, a circular center masking portion and a bridging portion for connecting said circular peripheral masking portion and said circular center masking portion, and said exhaust passages are formed in said circular peripheral masking portion, each of said exhaust passages having one end exposed to said inner side surface of said mask and an other end exposed to said lower side surface of said mask.

10. The sputtering apparatus of claim 9, wherein said bridging portion is constituted by four supporting rods connected perpendicular to each other.

11. The sputtering apparatus of claim 10, wherein the number of exhaust passages is four and said exhaust passages are formed in said circular peripheral masking portion at positions equally separated and situated between said four supporting rods.

12. The sputtering apparatus of claim 1, wherein each of said exhaust passages includes a first length L and diameter D portion at said first end and a second length L and diameter D portion at said other end, and wherein the lengths L of said first and second exhaust passage portions are determined to be L is less than or equal to 3D when the diameters D of said first and second exhaust portions are determined to be D is greater than or equal to $D \leq \lambda/2$, where $\lambda$ represents a mean free path of the target material.

13. A sputtering apparatus comprising:
a film-deposition chamber having a gas-supplying pipe connected thereto, for depositing a film on the surface of a substrate to be processed,
a rotatable magnet provided at a position over said film-deposition chamber.
a target provided at a position between said rotatable magnet and said film-deposition chamber,
a mask provided opposite said target in said film-deposition chamber, said mask being formed by a circular peripheral masking portion having at least an inner side surface and a lower side surface, a circular center masking portion having at least an outer side surface and a lower side surface, and a bridging portion consisting of plural supporting rods of the same length connecting said circular peripheral masking portion and said circular center masking portion, each of said supporting rods having both ends fixed respectively to said inner side surface of said circular peripheral masking portion and to said outer side surface of said circular center masking portion,
a transferring table means capable of rotating and moving vertically for holding said substrate in such a manner that the film-deposition surface of said substrate is caused to be in close contact with said lower side surface of said circular peripheral masking portion and with said lower surface of said circular center masking portion,
a transferring chamber for incorporating said transferring table, and
an exhaust vent provided in said transferring chamber, wherein said mask includes exhaust passages formed in the circular peripheral masking portion thereof, each of said exhaust passages consisting of a first exhaust passage having one end exposed to the inner side surface of said circular peripheral masking portion and a second exhaust passage having one end exposed to the lower side surface of said circular peripheral masking portion, said first and second exhaust passages being formed perpendicular to each other and communicating with each other such that gas can pass therethrough, whereby the gas in said film-deposition chamber can be exhausted to said transferring chamber through said exhaust passages while said substrate to be sputtered is held in close contact with said mask, and wherein the lengths L of said first and second exhaust passages are determined to be L is less than or equal to 3D when the diameters D of said first and second exhaust passages are determined to be D is greater than or equal to $D \leq \lambda/2$, where $\lambda$ represents a mean free path of the target material.

14. The sputtering apparatus of claim 13, wherein said first exhaust passages are directly connected to said second exhaust passages.

15. The sputtering apparatus of claim 14, wherein a plurality of said exhaust passages are formed between the positions at which said supporting rods are connected to said circular peripheral masking portion.

16. The sputtering apparatus of claim 15, wherein four exhaust passages are formed at equal intervals between the positions at which said supporting rods are connected to said circular peripheral masking portion.

17. The sputtering apparatus of claim 13, wherein said first exhaust passages are connected through cavity portions to said second exhaust passages, said cavity portions being formed in said circular peripheral masking portion.

18. The sputtering apparatus of claim 13, wherein the number of said supporting rods is four, and said supporting rods are perpendicular to each other.

19. A sputtering apparatus comprising:
a film-deposition chamber having a gas-supplying pipe connected thereto, for depositing a film on the surface of a substrate to be processed,
a target provided in said film-deposition chamber,
a mask provided opposite said target in said film-deposition chamber, said mask having an opening portion and a masking portion, and
holding means for holding said substrate against said mask in such a manner that the film-deposition surface of said substrate is in close contact with said mask,
wherein said mask further includes exhaust passages formed in the masking portion thereof, each of said exhaust passages having a first end exposed to the inside of said film-deposition chamber and an other end exposed to the outside of said film-deposition chamber, wherein each of said exhaust passage first ends and said other end thereof communicate with each other, but not in a straight line path, such that outside exhaust leakage of a sputtering gas is eliminated.

20. The sputtering apparatus of claim 19, wherein each of said exhaust passages includes a first length L and diameter D portion at said first end and a second length L and diameter D portion at said other end, and wherein the lengths L of said first and second exhaust passage portions are determined to be L is less than or equal to 3D when the diameters D of said first and second exhaust portions are determined to be D is greater than or equal to $D \leq \lambda/2$, where $\lambda$ represents a means free path of the target material.

* * * * *